United States Patent
Zheng

(10) Patent No.: US 7,061,941 B1
(45) Date of Patent: Jun. 13, 2006

(54) DATA INPUT AND OUTPUT CIRCUITS FOR MULTI-DATA RATE OPERATION

(75) Inventor: Hua Zheng, Fremont, CA (US)

(73) Assignee: Winbond Electronics Corporation America, San Jose, CA (US)

( * ) Notice: Subject to any disclaimer, the term of this patent is extended or adjusted under 35 U.S.C. 154(b) by 1010 days.

(21) Appl. No.: 09/724,306

(22) Filed: Nov. 28, 2000

(51) Int. Cl.
*H04L 12/50* (2006.01)
*H04Q 11/00* (2006.01)
*G11C 8/00* (2006.01)

(52) U.S. Cl. ............... 370/535; 370/358; 365/230

(58) Field of Classification Search ............ 370/464, 370/498, 535–539, 358–375; 365/185, 189–207, 365/221, 233–296; 375/296; 711/105, 153, 711/167, 170; 327/261–276; 714/700–734; 713/503–505
See application file for complete search history.

(56) References Cited

U.S. PATENT DOCUMENTS

| | | | | |
|---|---|---|---|---|
| 4,168,401 A * | 9/1979 | Molleron et al. | ........... | 370/358 |
| 4,841,524 A * | 6/1989 | Miyaou et al. | ........... | 370/535 |
| 5,684,421 A * | 11/1997 | Chapman et al. | ........... | 327/261 |
| 5,805,505 A * | 9/1998 | Zheng et al. | ........... | 365/189.05 |
| 5,995,441 A * | 11/1999 | Kato et al. | ........... | 365/233 |
| 6,094,396 A * | 7/2000 | Zheng | ........... | 365/230.03 |
| 6,097,640 A * | 8/2000 | Fei et al. | ........... | 365/189.02 |
| 6,157,560 A * | 12/2000 | Zheng | ........... | 365/63 |
| 6,229,367 B1 * | 5/2001 | Choudhury | ........... | 327/276 |
| 6,282,128 B1 * | 8/2001 | Lee | ........... | 365/189.04 |
| 6,314,052 B1 * | 11/2001 | Foss et al. | ........... | 365/233 |
| 6,480,428 B1 * | 11/2002 | Zheng et al. | ........... | 365/200 |
| 6,539,064 B1 * | 3/2003 | Ellis et al. | ........... | 375/296 |

\* cited by examiner

*Primary Examiner*—Man U. Phan
(74) *Attorney, Agent, or Firm*—Dinh & Associates

(57) ABSTRACT

Data input and output circuits that support multi data rate and a number of timing schemes. In one design, a data output circuit includes an input multiplexer, data latches, an output multiplexer, and at least one output driver. The input multiplexer receives a set of data bits in a first order (e.g., odd and even) and provides the data bits in a second order (e.g., first and second). The data latches can latch the data bits with (1) a latch signal to satisfy memory access timing requirements and (2) a data write clock signal to satisfy output timing requirements. The output multiplexer multiplexes the latched data bits to provide time multiplexed data bits. The output driver(s) provide signal drive for the time multiplexed data bits. Clock signals with various timing characteristics can be used to allow the data output circuit to satisfy various timing requirements.

34 Claims, 15 Drawing Sheets

DATA INPUT AND OUTPUT CIRCUITS FOR MULTI-DATA RATE OPERATION

BACKGROUND OF THE INVENTION

The present invention relates generally to memory devices, and more particularly to data input and output circuits capable of supporting multi (e.g., double) data rate operation and a number of timing schemes.

Memory devices are integral to computer systems, and to many electronic circuits. Continuous improvements in the operating speed and computing power of central processing units (CPUs) enable operation of an ever-greater variety of applications, many of which require larger and faster memories. Larger memories are characterized by having more memory cells to store more bits of data. Faster memories can be provided by reducing the time necessary for each read and write cycle and by allowing for access of multiple data bits on each clock cycle.

Memory devices can be designed to support a number of operating modes such as a single data rate (SDR) and a double data rate (DDR) mode. In the SDR mode, one data bit is accessed (i.e., written to or retrieved from the memory device) for each device input/output (I/O) pin and on each active clock cycle. In the DDR mode, two data bits are accessed for each device I/O pin on each active clock cycle. The memory devices may further be designed to support other operating modes such as a block write mode in which a block of data bits is concurrently written to memory.

Larger memory devices typically include many device I/O pins to support concurrent access of many data bits. The memory cells within a memory device are coupled to the I/O pins through a structure of interconnections. As the number of I/O pins increases and the number of memory cells in the memory device grows, the interconnection structure also grows in complexity. Moreover, the data input and output circuits to interface the memory cells to the device I/O pins become more complicated, particularly if the memory device is required to support a number of operating modes.

Memory devices are also designed to meet various timing specifications. When the operating speed is slow, these timing specifications can be more easily satisfied because of the longer clock period. However, as the operating speed increases, it becomes more challenging to meet these timing requirements. More complicated timing circuits are typically required to generate triggering signals for synchronous circuits within the memory device to ensure conformance with the input and output timing specifications.

As can be seen, data input and output circuits that can support multi data rate operation and a number of different timing schemes are highly desirable.

SUMMARY OF THE INVENTION

The invention provides data input and output circuits for use in an integrated circuit (e.g., a memory device) and capable of supporting multi data rate read and write operations and a number of timing schemes. The data input and output circuits include appropriate circuitry to receive data bits, latch the received data bits with triggering signals having the appropriate timing characteristics, multiplex (i.e., order) the data bits to generate data bits in the proper order, and provide the necessary signal drive. The triggering signals can have different timing characteristics, and are selected based on a particular operating mode of the memory device.

An embodiment of the invention provides a data output circuit that includes a first (input) multiplexer, data latches, and at least one output driver. The input multiplexer receives a set of data bits in a first order and provides the data bits in a second order. The data latches can latch the data bits in the second order with a latch signal to satisfy memory access timing requirements, and can further latch the data bits with a data write clock signal to satisfy output timing requirements. The data output circuit typically further includes a second (output) multiplexer that multiplexes the latched data bits to provide time multiplexed data bits. The output driver(s) receive and provide signal drive for the time multiplexed data bits. To achieve variable drive capability, a number of output drivers can be designed such that they can be individually enabled and disabled (e.g., all output drivers can be disabled to place the data output circuit a tri-state condition).

The signals used to trigger the synchronous circuits in the data output circuit can have different timing characteristics to allow the data output circuit to satisfy various timing requirements. For example, the latch signal can have a phase (e.g., delayed by a particular amount) that is selected based on an operating mode of the data output circuit. Also, the data read clock signal can be generate based on one of a number of clock signals, again depending on the particular operating mode, and may further have an adjustable phase determined, for example, by a delay lock loop circuit. The data bits provided to the input multiplexer can be prefetched from a memory array based on the failings edge of an input clock signal.

For a specific implementation that supports DDR read operation, the input multiplexer receives data bits associated with even and odd memory addresses and provides the data bits in first and second temporal order. One memory address can be provided for each pair of odd and even data bits and the other address can be generated internally based on a particular addressing scheme. For ease of implementation, the even and odd memory addresses can be consecutively numbered.

Another embodiment of the invention provides a data input circuit that includes a demultiplexer, a multiplexer, and a number of driver circuits. The demultiplexer can be implemented with a first set of latches that latches a sequence of time multiplexed data bits with a number of phases of a latch signal (which may be generated from a DQS signal) to provide a number of sequences of data bits. The multiplexer orders the sequences of data bits to provide ordered sequences. The data input circuit typically further includes a second set of latches that latches the ordered sequences with a data write clock signal. Each driver circuit then receives a respective sequence from the second set of latches and drives a respective data line.

For DDR write operation, the sequence of time multiplexed data bits includes two data bits per active cycle of an input clock signal and is demultiplexed into a first sequence of data bits corresponding to a first phase (e.g., rising edge) of the input clock signal and a second sequence of data bits corresponding to a second phase of the input clock signal. The multiplexer then orders the first and second sequences to provide an even sequence of data bits to be provided to memory cells having even addresses and an odd sequence of data bits to be provided to memory cells having odd addresses.

Yet another embodiment of the invention provides a memory unit that includes decoding circuitry, at least one memory array, conditioning circuitry, and a number of output circuits. The decoding circuitry receives address information and generates a set of control signals. The memory array(s) provide a number of sets of data values in response to the generated control signals, and the conditioning circuitry conditions the sets of data values to provide sets of data bits. Each output circuit receives a respective set of data bits and drives a respective data line. The output circuits can be designed as described above. The memory unit may further include a number of input circuits that facilitates the writing of data bits to the memory array(s).

Yet another embodiment of the invention includes a method for providing a number of data bits to an output node in a multi data rate operation. In accordance with the method, a set of data bits is received and ordered to provide ordered data bits that are then latched to provide latched data bits. The latched data bits can then be multiplexed into a sequence of time multiplexed data bits, which is then provided to the output node.

For DDR read operation, the received data bits can correspond to even and odd memory addresses and the ordered data bits can correspond to first and second temporal order to be provided to the output node. The data latching can include: (1) latching the ordered data bits with a latch signal to fulfill (e.g., memory access) timing requirements, (2) latching the first latched data bits with a data read clock signal to provide second latched data bits, and (3) latching one of the second latched data bits with the inverted data read clock signal to properly align the data bits. The latch signal and data read clock signal can be generated as described in detail below.

Yet another embodiment of the invention includes a method for providing a number of data bits to a memory array in a multi data rate operation. In accordance with the method, a sequence of time multiplexed data bits is received and demultiplexed into a number of sequences of data bits. The demultiplexing typically includes latching the time multiplexed data bits with a number of phases of a data latch signal to generate a number of sequences of data bits. The sequences are then ordered to provide ordered sequences. The ordered sequences may further be latched with a data write clock signal to generate sequences of latched data bits that are then provided to the memory array.

For DDR write operation, the sequence of time multiplexed data bits includes two data bits per active cycle of an input clock signal, and is demultiplexed into first and second sequences of data bits corresponding to first and second phases of the input clock signal. The first or second sequence is then selected as an even sequence to be provided to even-numbered address memory cells, and the other second or first sequence is selected as an odd sequence to be provided to odd-numbered address memory cells.

The data output and input circuits and the methods described above can be advantageously implemented within an integrated circuit, a DRAM device, and other devices. Various other aspects, embodiments, and features of the invention are described in further detail below.

The foregoing, together with other aspects of this invention, will become more apparent when referring to the following specification, claims, and accompanying drawings.

DESCRIPTION OF THE SPECIFIC EMBODIMENTS

For clarity, the invention is described for a specific implementation of a memory device. However, the specific details are intended to be illustrative, and not limitations, of the present invention. It will be recognized that alternative implementations of the invention and modifications of the circuits and architectures described herein can be made (e.g., to satisfy a particular design requirement), and these modifications and variations are within the scope of the invention.

Figure 1A:
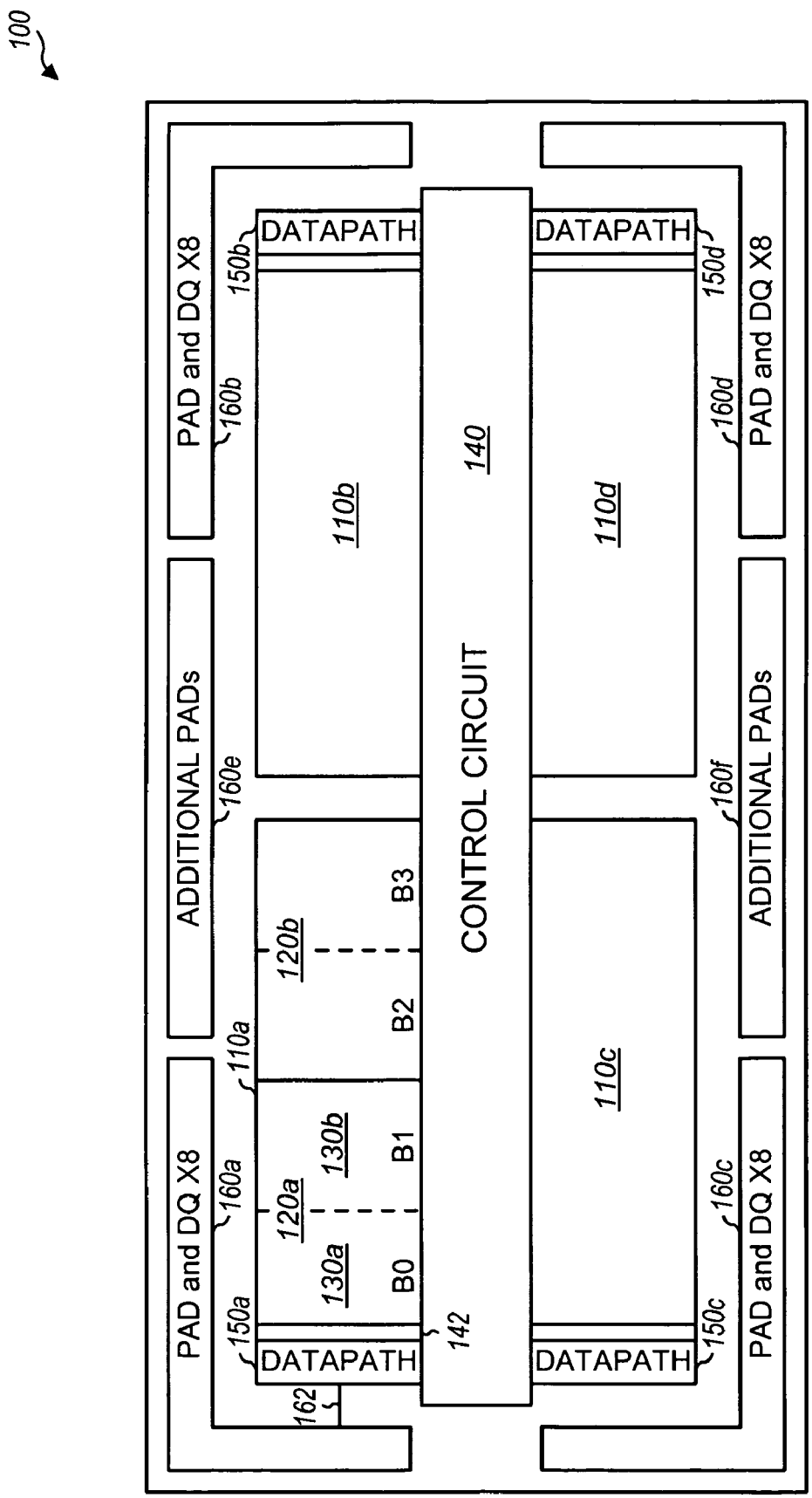
FIG. 1A is a diagram of a specific embodiment of a memory device.

FIG. 1A is a diagram of a specific embodiment of a memory device 100. In this embodiment, memory device 100 includes four memory arrays 110a through 110d, with each memory array 110 including two memory banks 120a and 120b. Each memory bank 120 includes an upper half 130a and a lower half 130b. A control circuit 140 couples to memory arrays 110a through 110d and provides the necessary control signals, clock signals, and reference voltages. Additional control and support circuitry may be dispersed throughout memory device 100. Some of these circuits are described below, as necessary for the understanding of the invention.

As shown in FIG. 1A, each memory array 110 is associated with a datapath 150 that interconnects the memory cells in the memory array to an associated set of data input/output (I/O) pads 160, one data I/O pad for each device data I/O pin. The I/O pads and I/O pins are also referred to as DQ pads and DQ pins, respectively. Additional pad sections 160e and/or 160f are provided for control signals, clock signals, address lines, power supplies, ground, and other inputs and outputs.

Generally, the memory device can include greater or fewer number of memory arrays, each memory array can include greater or fewer number of memory banks, and each memory bank can be configured differently than that shown in FIG. 1A. In certain embodiments, memory device 100 is DRAM device having at least 64 million bits (Mbits) of memory, and each memory array includes at least 16 Mbits of memory.

Each memory array 110 includes memory cells for many data bits. The memory cells are typically arranged in a two-dimensional array. A word line selects a particular row within the memory array, and a column select line selects a particular column. Thus, each memory cell is identified by a unique combination of word line and column select line. A set of word line drivers associated with each memory array activates the word lines for that memory array, and a column decoder associated with each memory bank activates the column select lines for that memory bank. In an embodiment, a column decoder 142 is associated with each array 120. The word line drivers and portions of the column decoders are implemented within control circuit 140.

The word lines and column select lines are activated in accordance with memory addresses provided by a source external or internal to memory device 100. The generation of the control signals is described in further detail in U.S. patent application Ser. No. 09/427,150, entitled "Clock-Based Transparent Refresh Mechanisms for DRAMs," filed Oct. 25, 1999, assigned to the assignee of the present invention and incorporated herein by reference.

In an embodiment, the memory cells in each memory array are arranged into a number of sections, with each section corresponding to a particular set of memory addresses. For example, in an implementation that advantageously supports double data rate (DDR) operation, the memory cells are arranged into odd and even sections, with the odd section including memory cells having odd-numbered addresses and the even section including memory cells having even-numbered addresses. For a DDR memory access, two data bits are retrieved from, or written to, an even and an odd section of the memory array for each "active" clock cycle.

Figure 1B:
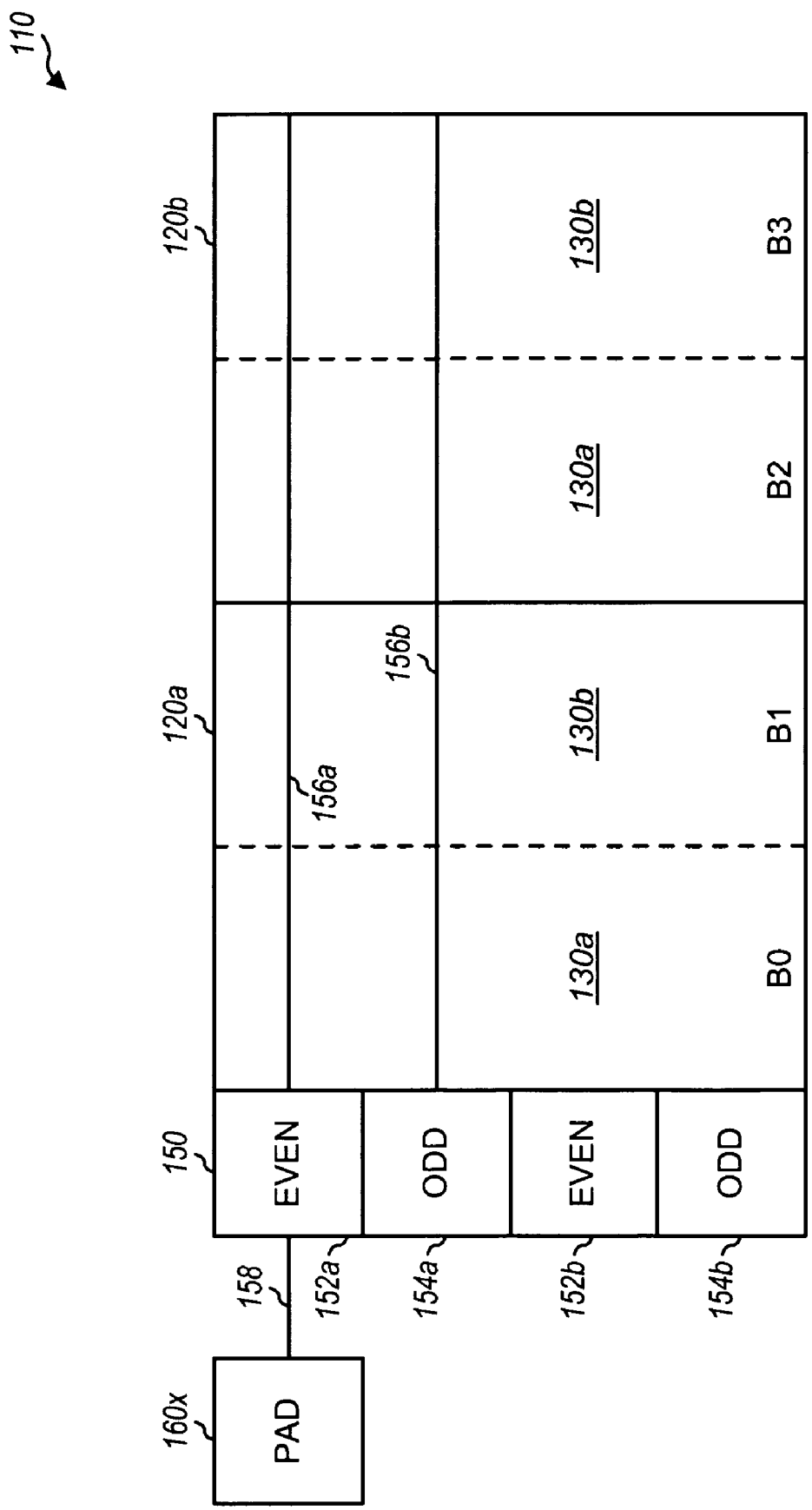
FIG. 1B is a diagram of a specific embodiment of a memory array and a datapath within the memory device.

FIG. 1B is a diagram of a specific embodiment of memory array 110 and datapath 150. In this embodiment, datapath 150 is partitioned into two sets of alternating even section 152 and odd section 154 that are associated with corresponding even and odd sections of memory array 110. Datapath 150 couples to a set of global data lines 156, two of which are shown in FIG. 1B. Each global data line 156 traverses the length of the associated memory array and couples to a respective set of memory cells. Datapath 150 further couples to an associated set of DQ pads 160 via a set of pad lines 158 (one DQ pad 160x and one pad line 158 are shown in FIG. 1B). Via the DQ pads, pad lines, datapath, and global data lines, input data bits are written to the memory cells in the memory device and stored data bits are read from the memory cells.

A design of a datapath that supports a number of different operating modes is disclosed in U.S. patent application Ser. No. 09/236,509, entitled "Memory Array Datapath Architecture," filed Jan. 25, 1999, assigned to the assignee of the present invention and incorporated herein by reference.

Figure 2:
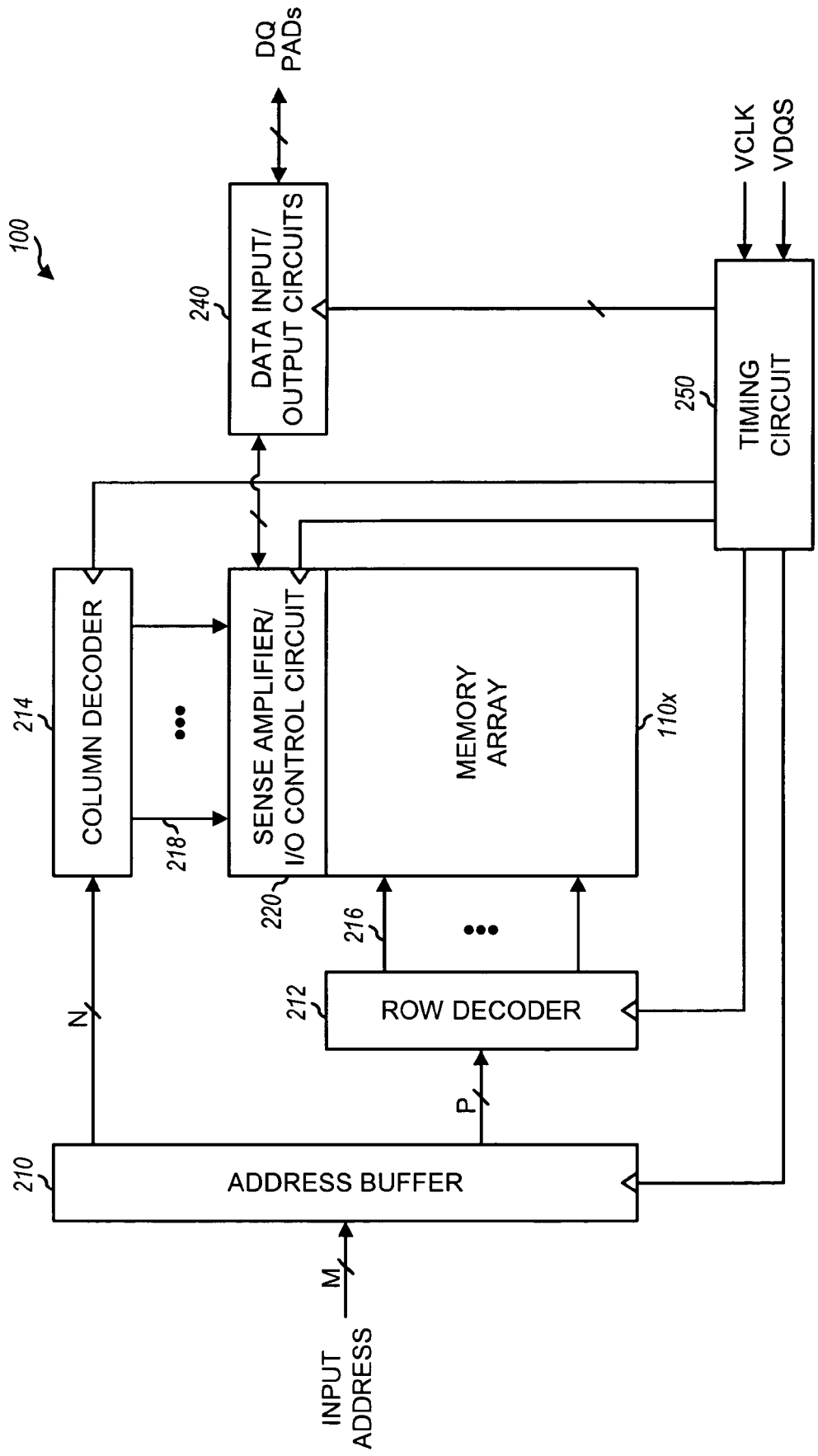
FIG. 2 is a simplified diagram of some of the circuitry within the memory device.

FIG. 2 is a simplified diagram of some of the circuitry within memory device 100. As shown in FIG. 2, memory device 100 includes an address buffer 210 for receiving an input address and providing buffered address information to a row decoder 212 and a column decoder 214. Row decoder 212 activates one or more row control lines (or word lines) 216 for the selected memory cell(s), as determined by the address information received from buffer 210. For a multi-data rate operation, row decoder 212 may select two or more of word lines to allow concurrent access to multiple memory cells.

Similarly, column decoder 214 activates one or more column select lines (CSLs) 218 for the selected memory cell(s), as determined by the address information received from address buffer 210. Column select lines 218 couple to a sense amplifier and I/O control circuit 220. Circuit 220 further couples to a memory array 110x and data input/output circuits 240. Circuit 220 provides the signal conditioning and drive for the signals to and from memory array 110x. Circuit 220 further provides the control and signal buffering for the signals to and from data input/output (I/O) circuits 240. Circuits 240 provide signal buffering and drive for retrieved data bits to be provided to the DQ pads, signal buffering for input data bits to be provided to the memory array, and other functions. A timing circuit 250 generates the clock and control signals for various synchronous circuits within memory device 100.

Figure 3A:
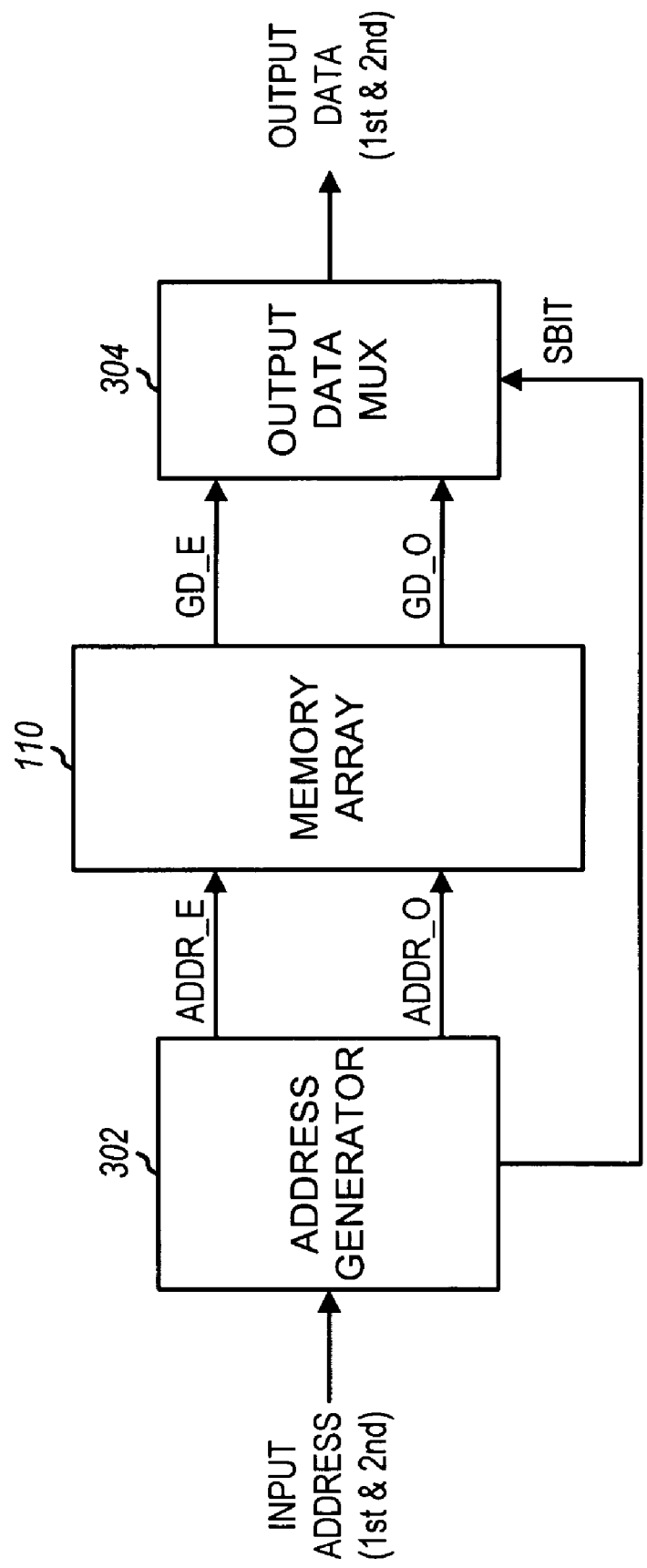
FIG. 3A is a block diagram of an addressing and data output structure for an access of two data bits in a double data rate (DDR) mode.

FIG. 3A is a block diagram of an addressing and data output structure for an access of two data bits in the DDR mode. To access two data bits, an address of the memory cell for the first data bit is provided and the address of the memory cell for the second data bit is (internally) generated by an address generator 302 from the first address based on a particular addressing scheme. For example, in one simple scheme, the second address is generated by simply incrementing the first address by one. For ease of implementation, the two accessed data bits typically have consecutively numbered addresses (i.e., ADDR and ADDR+1), but this is not a necessary condition. For the above design, address generator 302 generates an odd address and an even address for memory array 110. Address generator 302 further generates a signal SBIT indicative of the particular order of the odd and even-numbered data bits being accessed.

In an embodiment, memory array 110 is arranged such that concurrent memory access of a number of data bits can be achieved. In an embodiment, to support concurrent access of two data bits in the DDR mode, the memory cells in each memory array are arranged into even-numbered address memory cells and odd-numbered address memory cells. Appropriate support circuitry (e.g., data sense amplifiers) is provided to allow for concurrent access of one even-numbered address memory cell (or simply, even memory cell) and one odd-numbered address memory cell (or simply, odd memory cell) for each active clock cycle.

The odd and even-numbered data bits are prefetched from memory array 110 and provided to an output data multiplexer 304. In an embodiment, the memory cells being accessed are not restricted to any particular order of even and odd addresses. For example, an even memory cell may be accessed before an odd memory cell (e.g., memory cells with addresses xxxx0 and xxxx1) or an odd memory cell may be accessed before an even memory cell (e.g., memory cells with addresses xxxx1 and xxxx0). Thus, after the data in the memory cells are prefetched, the data bits from the even and odd memory cells are appropriately arranged such that they are provided to the DQ pad in the proper order. This is achieved with the signal SBIT from address generator 302.

Figure 3B:
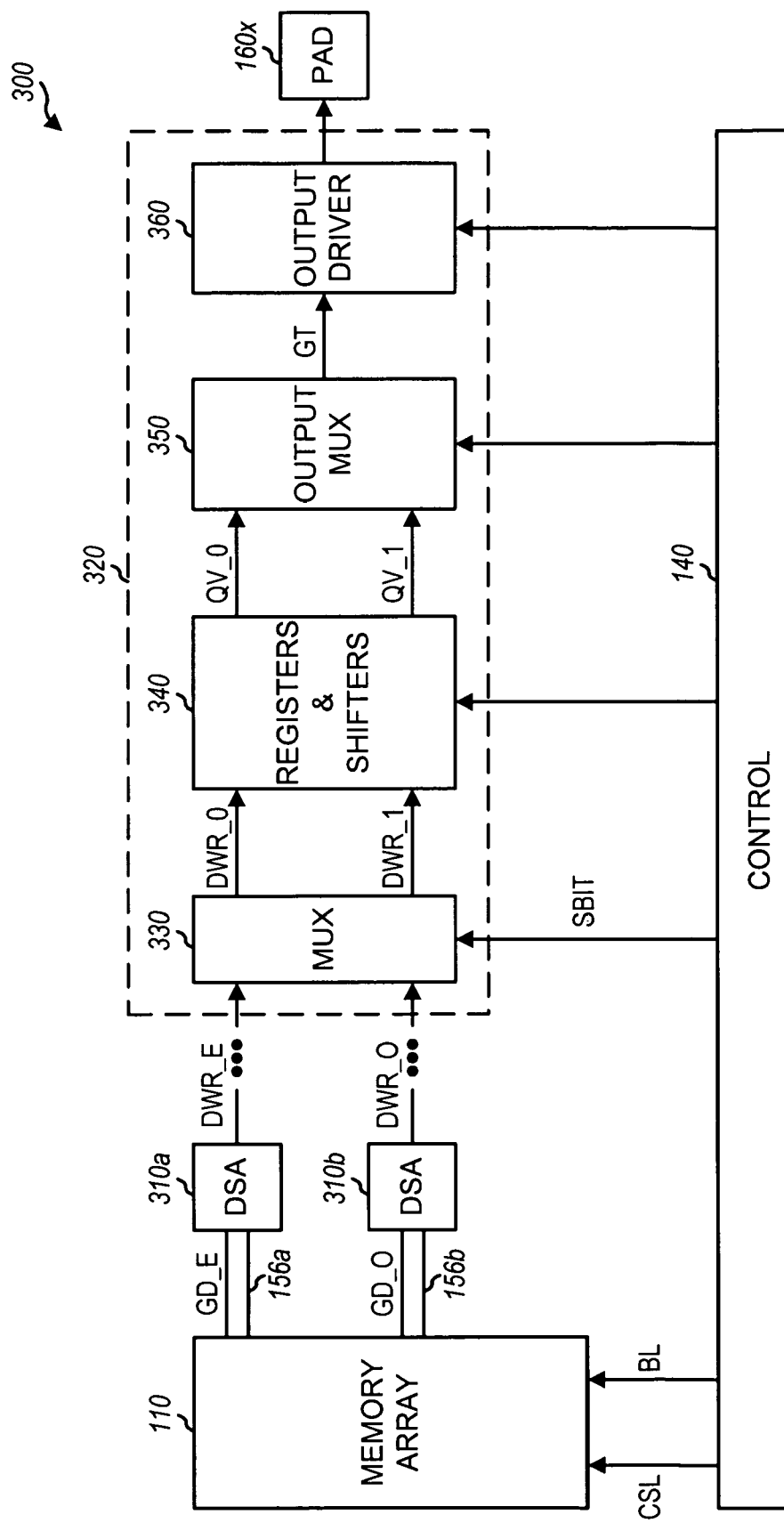
FIG. 3B is a block diagram of an embodiment of a data output architecture capable of providing a set of data bits from a memory array to a DQ pad in a memory read operation.

FIG. 3B is a block diagram of an embodiment of a data output architecture 300 capable of providing a set of data bits from the memory cells in memory array 110 to pad 160x. Architecture 300 is one implementation of output data multiplexer 304. A portion of data output architecture 300 is incorporated within sense amplifier and I/O control circuit 220 and the remaining portion is incorporated within data I/O circuits 240.

For a memory read operation in the DDR mode, the word lines and column select lines for memory array 110 are appropriately selected and activated such that two data bits from two memory cells are prefetched and provided on two sets of differential global data lines GD_E 156a and GD_O 156b to two data sense amplifiers (DSAs) 310a and 310b. Each data sense amplifier 310 senses the signal on the associated differential data lines 156 and provides an output signal having a value (e.g., "0" or "1") indicative of the sensed signal. As indicated in FIG. 3B, data sense amplifier 310a senses the even memory cell and data sense amplifier 310b senses the odd memory cell. The even and odd data bits from data sense amplifiers 310a and 310b are provided via respective data lines DWR_E and DWR_O to a data output circuit 320.

Within data output circuit 320, a multiplexer 330 receives the even and odd data bits on respective data lines DWR_E and DWR_O, selects either the even or odd data bit as the first data bit to be provided to the DQ pad (depending on the memory address), and selects the other odd or even data bit as the second data bit to be provided to the DQ pad. The first and second data bits are then provided via respective data lines DWR_0 and DWR_1 to registers and shifter 340.

Registers and shifter 340 latches the data bits on data lines DWR_0 and DWR_1 with the appropriate clock signals, as described below, and also provides a one-half clock cycle of delay for the second data bit to be provided to the DQ pad. The time aligned data bits are then provided from registers and shifter 340 via two respective data lines QV_0 and QV_1 to an output multiplexer 350 that multiplexes both data bits onto one data line GT. The multiplexed data bits are then provided to an output driver 360 that buffers the data bits and drives DQ pad 160x.

Figure 3C:
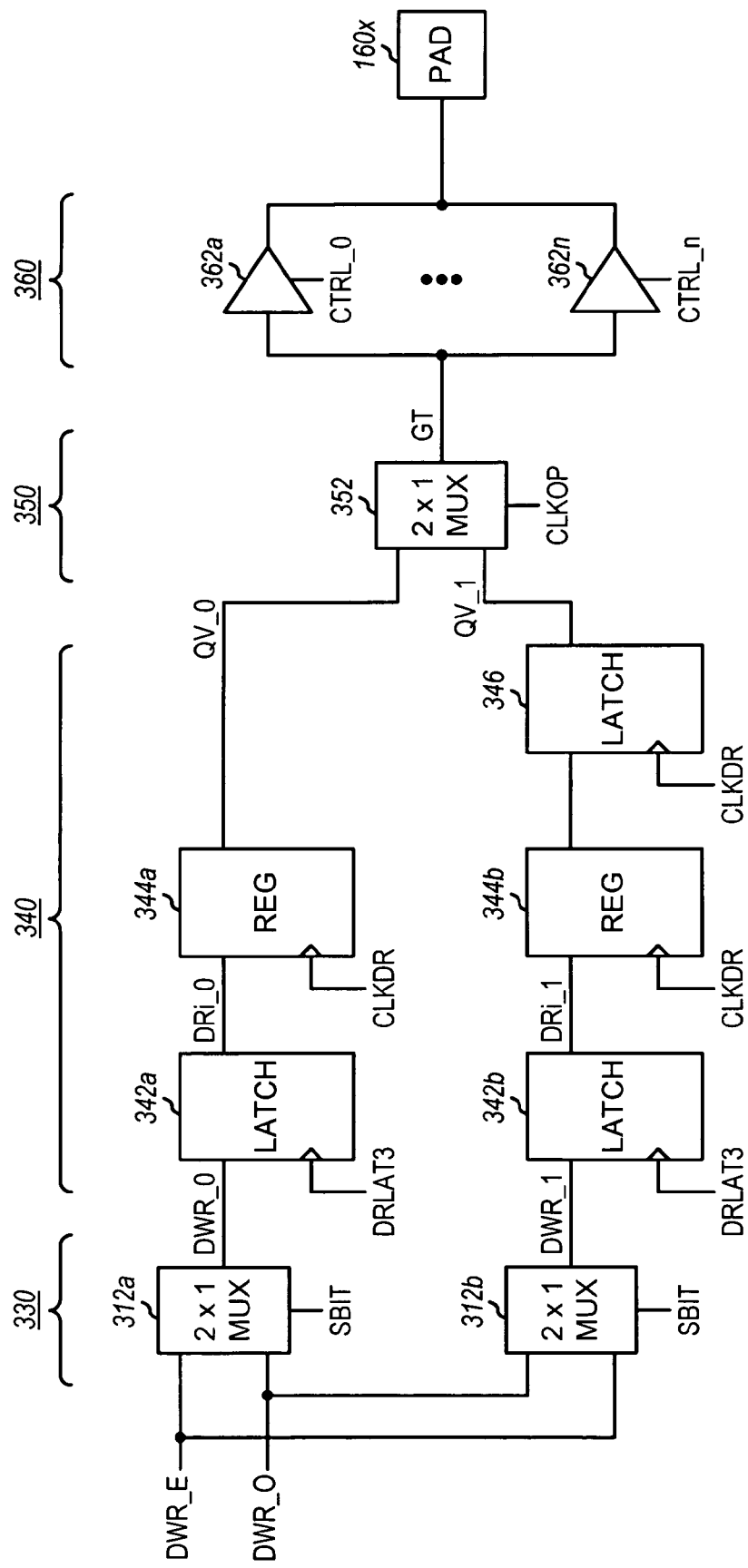
FIG. 3C is a diagram of an embodiment of the multiplexer, registers and shifter, output multiplexer, and output driver of a data output circuit.

FIG. 3C is a diagram of an embodiment of multiplexer 330, registers and shifter 340, output multiplexer 350, and output driver 360 of data output circuit 320. The even and odd data bits on data lines DWR_E and DWR_O are respectively provided to 2×1 multiplexers 332a and 332b. Multiplexer 332a selects either the even or odd data bit as the first bit to be provided to the DQ pad, depending on a control signal SBIT which is generated based on the memory address, and provides the selected data bit to data line DWR_0. Similarly, multiplexer 332b selects either the odd or even data bit as the second bit to be provided to the DQ pad, again depending on the control signal SBIT, and provides the selected data bit to data line DWR_1.

The first and second data bits from multiplexers 332a and 332b are then provided to latches 342a and 342b, respectively. Each latch 342 latches the received data bit with a latch signal DRLAT3 and provides the latched data bit to a respective register 344. Latching the data bits with the latch signal DRLAT3 allows data output circuit 320 to support a number of read modes. Each read mode corresponds to a particular timing relationship between a read command and when data is available from a data buffer. For example, the read modes can include the various column address select (CAS) latencies (i.e., timing delays) such as the CAS latency 2 and CAS latency 3 described in U.S. Pat. No. 5,986,945, entitled "Memory Device Output Circuit Having Multiple Operating Modes," issued Nov. 16, 1999, assigned to the assignee of the present invention and incorporated herein by reference. Typically, the read mode is known a priori before the device is accessed, and may be determined from a value stored in a mode setting register. Latches 342 thus ensure that the data bits from the memory cells are triggered in a manner that satisfies the timing specifications. In certain designs, latches 342 may be omitted if support for these different various timing modes (e.g., CAS latency 3) is not required nor desired. For example, latches 342 may be removed or forced ON for CAS latency 2.

The latched data bits from latches 342a and 342b are respectively provided to registers 344a and 344b, which register the received first and second data bits with a data read clock signal CLKDR. The second data bit from register 344b is then provided to a latch 346 and latched with a clock signal CLKDR. Latch 346 provides a half clock cycle of delay for the second data bit.

In accordance with an aspect of the invention, the data read clock signal CLKDR has different timing characteristics for different read modes. These timing characteristics are designed and selected to meet the system timing requirements and are described in further detail below. For example, the data read clock signal CLKDR may be generated from one of several clock signals. Alternatively or additionally, the clock signal CLKDR may be delayed by different amounts for different read modes.

The data bits from register 344a and latch 346 are then provided via respective data lines QV_0 and QV_1 to a 2×1 multiplexer 352 that multiplexes the data bits onto one output data line GT. The time multiplexed data bits on data line GT are then provided to a set of line drivers 362a through 362n. Each line driver 362 also receives a respective control signal $CTRL_{13}$ i (where i=0, 1, 2, ... or n) and, when enabled by the control signal, drives DQ pad 160x.

In an embodiment, zero or more line drivers 362 can be enabled at any given moment. Zero line drivers 362 are enabled, for example, when DQ pad 160x is operative to receive data bits to be written to the memory array. One or more line drivers 362 are enabled to provide data bits to the DQ pad. The number of line drivers enabled is typically based on the required drive strength. Generally, as more line drivers are enabled, the drive strength increases and the signal transitions are enhanced (i.e., sharpened). The line drivers can be designed to provide approximately equal drive strengths (e.g., by designing the line drivers with similar physical dimensions) or different drive strengths. For example, line driver 362a may be designed to provide half the drive strength of line driver 362b, which may be designed to provide half the drive strength of line driver 362c, and so on.

Figure 4A:
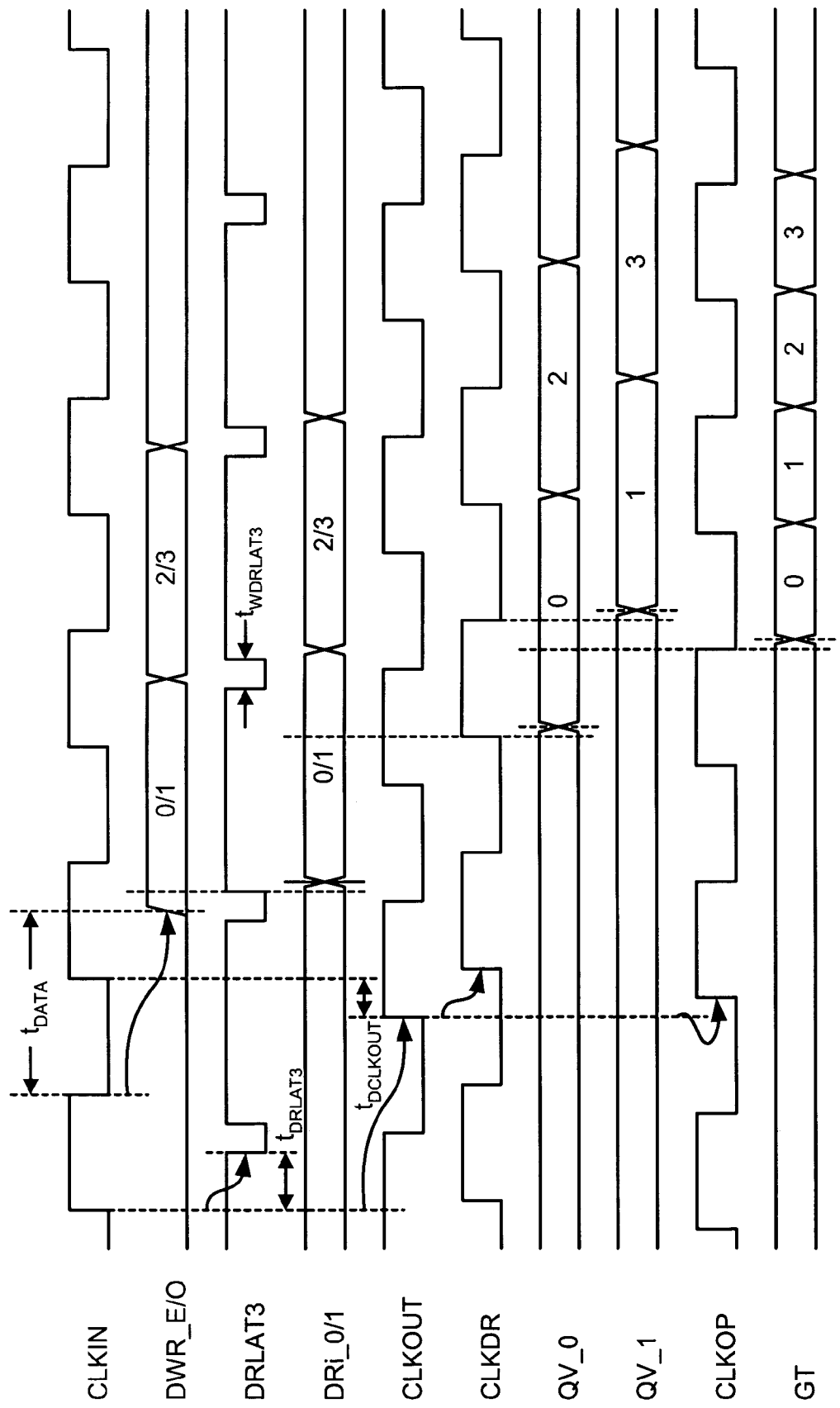
FIGS. 4A and 4B are timing diagrams for a DDR read operation to read two data bits from the memory array on each active clock cycle for a fast and a slow input clock signal CLKIN, respectively.

FIG. 4A is a timing diagram for a DDR read operation to read two data bits from the memory array on each active clock cycle for a fast input clock signal CLKIN. The input clock signal CLKIN is generated by buffering a clock signal VCLK provided on one of the device pins. In the embodiment shown in FIG. 4A, the rising edge of the clock signal CLKIN is used to generate the latch signal DRLAT3 and an output clock signal CLKOUT. Generation of the clock signals is described in further detail below. The falling edge of the clock signal CLKIN is used to access the memory cells and the accessed data bits are available on data lines DWR_E and DWR_O some delay period later (i.e., delayed by $t_{DATA}$ from the falling edge of the input clock signal CLKIN).

As shown in FIG. 4A, the latch signal DRLAT3 has falling edges that are delayed relative to the rising edges of the input clock signal CLKIN by a delay period $t_{DRLAT3}$. The rising edges of the latch signal DRLAT3 occur a particular time period $t_{WDRLAT3}$ after the falling edges of the latch signal and are used to latch the data on data lines DWR_E and DWR_O. Since the memory access time $t_{DATA}$ is typically fixed, the signal transitions on data lines DWR_E and DWR_O occur toward the rising edges of the latch signal DRLAT3 when the input clock signal CLKIN is fast. However, the latch signal DRLAT3 is designed (i.e., the rising edges are appropriately delayed) such that it is able to latch the data on data lines DWR_E and DWR_O on the rising edges. The latched data is then provided on data lines DRi_0 and DRi_1.

The output clock signal CLKOUT is the main clock signal used throughout the memory device to either latch the data on various data lines or to generate clock signals that are then used to latch the data. To provide output data that is aligned to the rising edges of the input clock signal CLKIN (which is required for some memory designs), a delay lock loop (DLL) is used to generate the output clock signal CLKOUT such that its rising edges lead the rising edges of the input clock signal CLKIN by a particular amount of time $t_{DCLKOUT}$. The lead time $t_{DCLKOUT}$ allows the output clock signal CLKOUT to be used to trigger the data such that it is aligned with the input clock signal CLKIN at the device pins. The output clock signal CLKOUT is thus advanced relative to the input clock signal CLKIN by an amount $t_{DCLKOUT}$ that is dependent on the system requirements and the particular memory design (e.g., $t_{DCLKOUT} \approx 1.5$ nsec in some memory device designs).

In accordance with an aspect of the invention, a number of read and write modes are provided to support different read and write timing schemes. Each read or write mode is associated with a particular set of clock signals used for writing data bits to the memory device or reading data bits from the memory device. The clock signals in each read or write mode are selected such that the timing requirements are met. The particular read or write mode can be selected by a mode setting register, a control signal provided internally or by an external source, fuses, or by some other mechanisms.

In an embodiment, the supported modes include a DLL_ON mode and a DLL_OFF mode. The DLL_ON mode is characterized by the use of a delay locked loop (DLL) to generate the clock signals and other triggering signals, and the DLL_OFF mode is characterized by the use of the input clock signal CLKIN to generate some of the clock signals used for triggering the data. Since the delay locked loop can adjust the timing of the clock signals to ensure fulfillment of the timing specifications, the DLL_ON mode can be used for a fast input clock signal CLKIN and the DLL_OFF mode can be used for a slow input clock signal CLKIN.

The delay locked loop can also be used to adjust for timing skews within the memory device. Referring back to FIG. 1A, each set of data I/O pads 160 is located at a respective corner of the integrated circuit and receives a respective set of one or more clock signals for clocking data from the memory device. Due to layout and other factors, the timing between the four sets of data I/O pads may have different timing. The delay locked loop can be used to adjust the timing of the clock signals such that the data provided on the four sets of pads are properly aligned.

In an embodiment, the data read clock signal CLKDR is generated based on the output clock signal CLKOUT in the DLL_ON mode (e.g., by delaying and inverting the output clock signal, as shown in FIG. 4A) and based on the input clock signal CLKIN in the DLL_OFF mode. The use of different clock signals to generate the data read clock signal CLKDR ensures that the timing specifications are met for different operating modes and conditions. The clock signals used for the generation of the data read clock signal CLKDR are shown in Table 1 and described in FIG. 7.

The rising edges of the data read clock signal CLKDR are used to register the first and second data bit on data lines DRi_0 and DRi_1. The registered second data bit is then latched with the data read clock signal CLKDR to provide a half clock cycle delay. As shown in FIG. 4A, after the registers and latch, the first data bit is provided on data line QV_0 on the rising edges of the data read clock signal CLKDR, and the second data bit is provided on data line QV_1 on the falling edges of the data read clock signal CLKDR.

The appropriately time-aligned data bits on data lines QV_0 and QV_1 are then multiplexed onto one data line GT by the output multiplexer with a clock signal CLKOP. In an embodiment, the clock signal CLKOP is generated based on the output clock signal CLKOUT in the DLL_ON mode (e.g., by delaying the output clock signal, as shown in FIG. 4A) and based on the input clock signal CLKIN in the DLL_OFF mode. Again, the clock signals used for the generation of the clock signal CLKOP are shown in Table 1 and described in FIG. 7. As shown in FIG. 4A, the first data bit on data line QV_0 is provided from the output multiplexer when the clock signal CLKOP is low, and the second data bit on data line QV_1 is provided from the multiplexer when the clock signal CLKOP is high. FIG. 4A shows a memory access of four data bits, which are provided to the DQ pad on two cycles of the input clock signal CLKIN.

TABLE 1

| Signal | DLL_ON Mode | DLL_OFF Mode |
| --- | --- | --- |
| DRLAT3 | CLKIN | CLKIN |
| CLKDR | CLKOUT | CLKIN |
| CLKOP | CLKOUT | CLKIN |
| CLKDW | CLKIN | CLKIN |

Figure 4B:
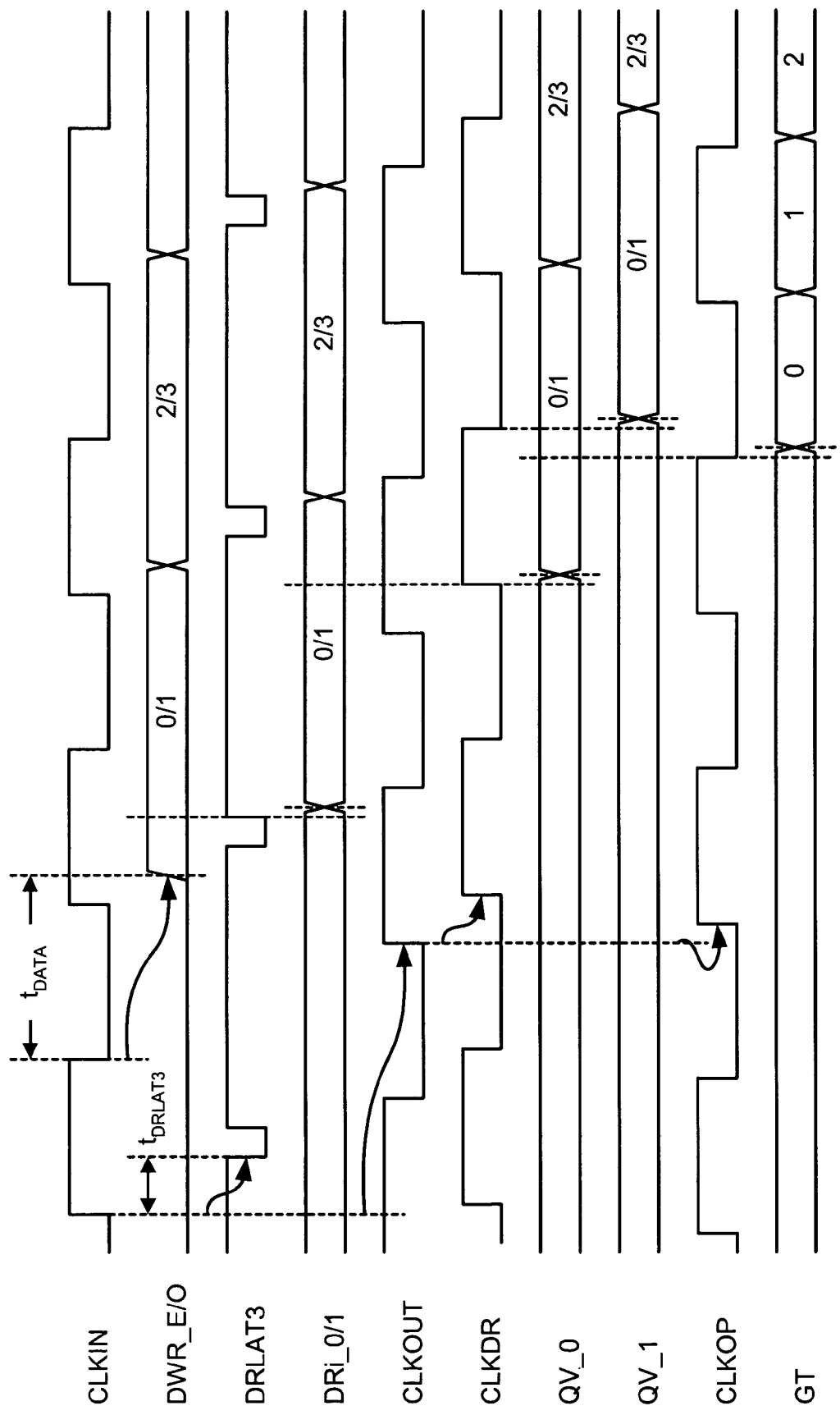

FIG. 4B is a timing diagram for a DDR read operation to read two data bits from the memory array for a slow input clock signal CLKIN. The memory cells are prefetched on the falling edges of the input clock signal CLKIN, and the accessed data bits are provided on data lines DWR_E and DWR_O a particular delay later. The data access delay $t_{DATA}$ is typically the same regardless of the speed of the input clock signal CLKIN. The latch signal DRLAT3 is also generated from the rising edges of the input clock signal CLKIN and has falling edges that are delayed relative to the rising edges of the input clock signal CLKIN by the delay period $t_{DRLAT3}$. However, because of the longer input clock cycle, the timing margin between the signal transitions on data lines DWR_E and DWR_O and the rising edges of the latch signal DRLAT3 is greater when the input clock signal is slow. The subsequent timing and data latching in FIG. 4B is similar to that in FIG. 4A.

Figure 5:
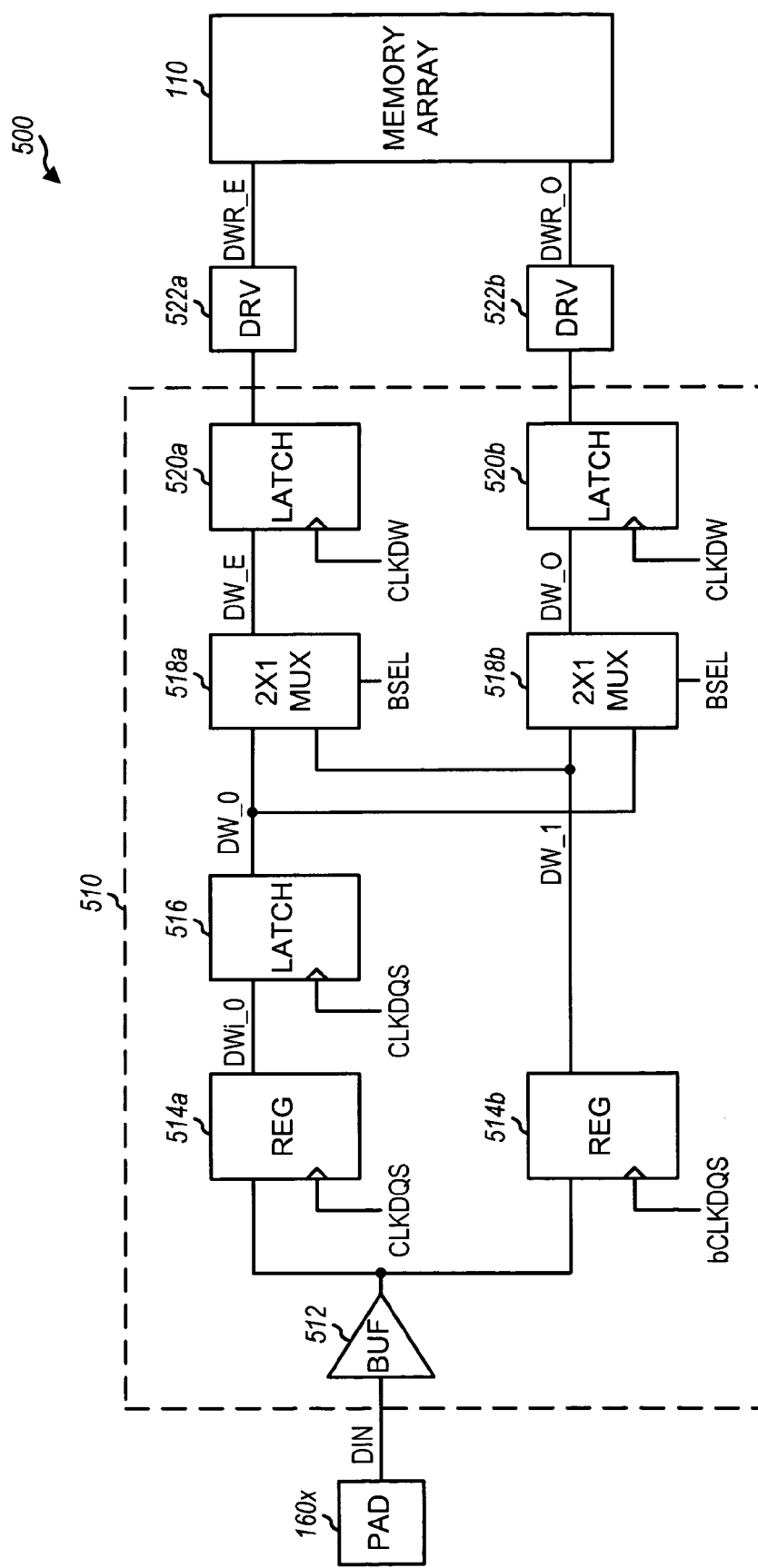
FIG. 5 is a block diagram of an embodiment of a data input architecture capable of writing a set of data bits provided on a DQ pad to the memory array in a memory write operation.

FIG. 5 is a block diagram of an embodiment of a data input architecture 500 capable of writing a set of data bits provided on pad 160x to memory array 110. The data bits to be written to the memory array are provided via DQ pad 160x to data input circuit 510. Within data input circuit 510, a buffer 512 receives and buffers the data bits and provides the buffered bits to registers 514a and 514b. For a DDR write operation, two data bits are provided on each active cycle of the input clock signal CLKIN.

A memory device is typically provided with a data strobe signal VDQS that indicates the availability of data on the device data pins. For a DDR write, each data bit is associated with a rising or falling edge on the data strobe signal VDQS and is provided to meet the specified setup and hold time requirements such that the associated VDQS edge can be used to latch the data bit within the memory device. The rising edges of the data strobe signal VDQS are aligned to the rising edges of the input clock signal CLKIN within a specified time period (e.g., ±0.25$t_{CLKIN}$, where $t_{CLKIN}$ is the period of the input clock signal CLKIN). In a nominal case, the $t_{DQSS}$ delay between the data strobe signal VDQS and the input clock signal CLKIN is approximately zero. However, the worse case delay between the data strobe signal VDQS and the input clock signal CLKIN is typically specified to be 0.25$t_{CLKIN}$. Thus, the maximum $t_{DQSS}$ delay is +0.25$t_{CLKIN}$ and minimum $t_{DQSS}$ delay is –0.25$t_{CLKIN}$, where +$t_{DQSS}$ indicates the data strobe signal VDQS leading the input clock signal CLKIN and –$t_{DQSS}$ indicates the data strobe signal VDQS lagging the input clock signal CLKIN.

The buffered data bits are then provided to registers 514a and 514b that register the data bits with the rising and falling edges of a signal CLKDQS. The signal CLKDQS is generated by buffering the data strobe signal VDQS and is closely aligned to the VDQS signal. The registered data bit from register 514a is then latched with the signal CLKDQS to provide a half clock cycle of delay to appropriately align the pair of data bits provided on each active clock cycle. The data bit from latch 516 and the data bit from register 514b are then provided via respective data lines DW_0 and DW_1 to multiplexers 518a and 518b.

Analogous to the memory read operation described above, the data bits to be written to the memory device are not restricted to any particular order of even and odd addresses. For example, the first data bit may correspond to an even memory address and the second data bit may correspond to an odd memory address, or vice versa. Thus, after the data bits are latched, they are appropriately routed to the even and odd data lines DW_E and DW_O to be written to the proper memory cells.

Multiplexer 518a selects either the first or second data bit as the even data bit to be provided to the memory array, depending on a control signal BSEL which is generated based on the memory address. Similarly, multiplexer 518b selects either the second or first data bit as the odd data bit to be provided to the memory array depending on the control signal BSEL. The even and odd data bits are then provided to respective latches 520a and 520b and latched with a data write clock signal CLKDW, which is generated from the input clock signal CLKIN as described below.

The latched data bits from latches 520a and 520b are then provided to respective drivers 522a and 522b, which buffer the data bits and drive data lines DWR_E and DWR_O to effectuate the writing of the data bits to memory.

Figure 6A:
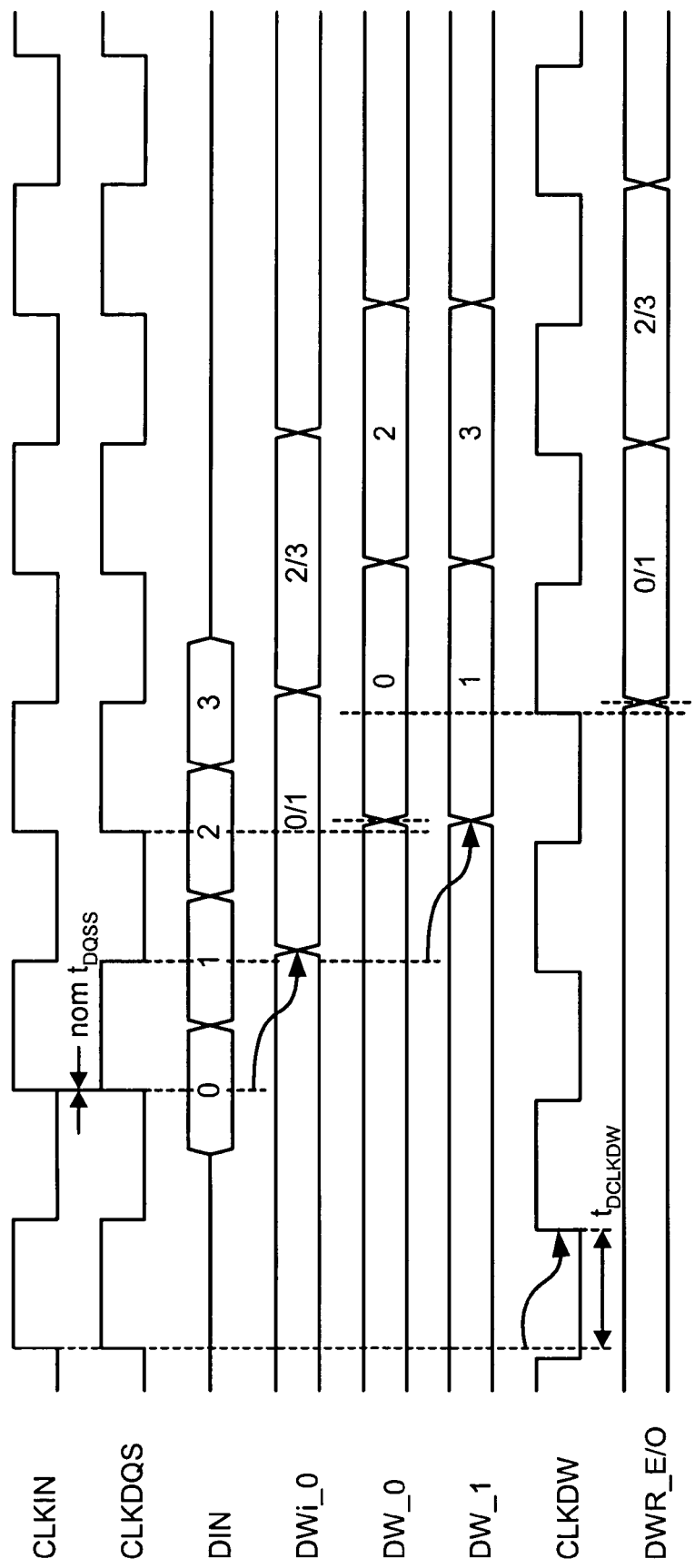
FIGS. 6A through 6C are timing diagrams for a DDR write operation to write two data bits to two memory cells on each active clock cycle of the input clock signal CLKIN for a nominal, minimum, and maximum $t_{DQSS}$ delay, respectively.

FIG. 6A is a timing diagram for a DDR write operation to write two data bits to two memory cells on each active clock cycle of the input clock signal CLKIN for a nominal (i.e., ~0 nsec) $t_{DQSS}$ delay. The input data DIN is provided with the input data strobe signal VDQS. The data strobe signal VDQS is gated such that an edge is provided for each data bit (i.e., the data strobe signal VDQS transitions from a high-Z state to a logic low pre-amble, to a state where the required clock edges are provided for the data burst, then to a logic low post-amble, and then to the high-Z state). The rising edge of the data strobe signal VDQS is typically specified to be within ±0.25 $t_{CLKIN}$ of the rising edge of the input clock signal CLKIN. For a nominal $t_{DQSS}$ delay of ~0.0 nsec, the rising edge of the data strobe signal VDQS is approximately aligned with the rising edge of the input clock signal CLKIN. The signal CLKDQS is generated by buffering the data strobe signal VDQS and used to latch the input data bits.

As shown in FIG. 5, the first data bit is registered with the rising edge of the signal CLKDQS by register 514a and the second data bit is registered with the falling edge of the signal CLKDQS (i.e., bCLKDQS) by register 514b. Each register is implemented with two latches coupled in series. The first latch latches the data with the indicated triggering signal (i.e., the signal CLKDQS for register 514a and the signal bCLKDQS for register 514a). The second latch then re-latches the data with the inverted triggering signal. Thus, each register provides the registered data bit on the opposite edge of the indicated triggering signal. Register 514a thus provides the first data bit on the falling edge of the signal CLKDQS and register 514b provides the second data bit on the rising edge of the signal CLKDQS. The first data bit from register 514a is then latched with the rising edge of the signal CLKDQS to provide a half cycle of delay. After the registers and latch, the first and second data bits are approximately aligned to the rising edge of the signal CLKDQS and provided on data lines DW_0 and DW_1.

The first and second data bits are then latched with a data write clock signal CLKDW, which is generated based on the input clock signal CLKIN. Since the rising edge of the data strobe signal VDQS is specified to be within ±0.25$t_{CLKIN}$ of the rising edge of the input clock signal CLKIN, and the data bits are initially latched with the signal CLKDQS that is generated from and slightly delayed relative to the data strobe signal VDQS, the data write clock signal CLKDW is delayed relative to the input clock signal CLKIN by at least ±0.25$t_{CLKIN}$. This ensures that the input data bits, after having been latched by the signal CLKDQS, will be properly latched by the data write clock signal CLKDW. Thus, as shown in FIG. 6A, the data write clock signal CLKDW is generated from the input clock signal CLKIN and delayed by a time period $t_{DCLKDW}$. The data bits on data lines DW_0 and DW_1 are latched with the data write clock signal CLKDW and provided on data lines DWR_E and DWR_O.

Figure 6B:
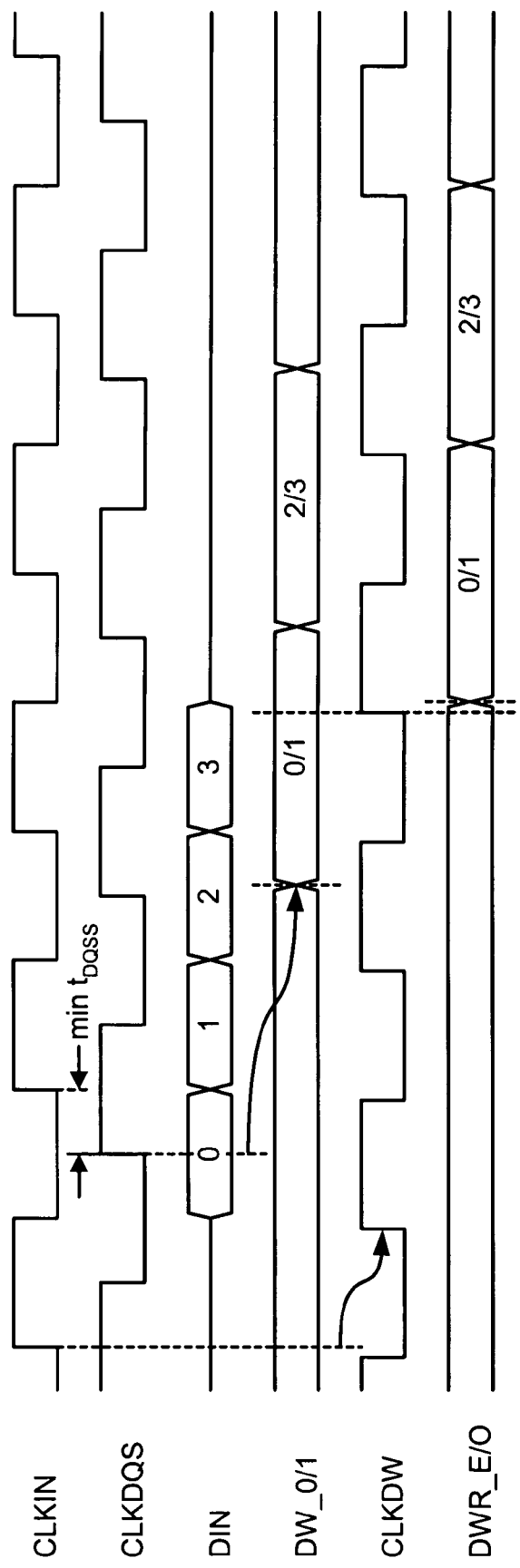
Figure 6C:
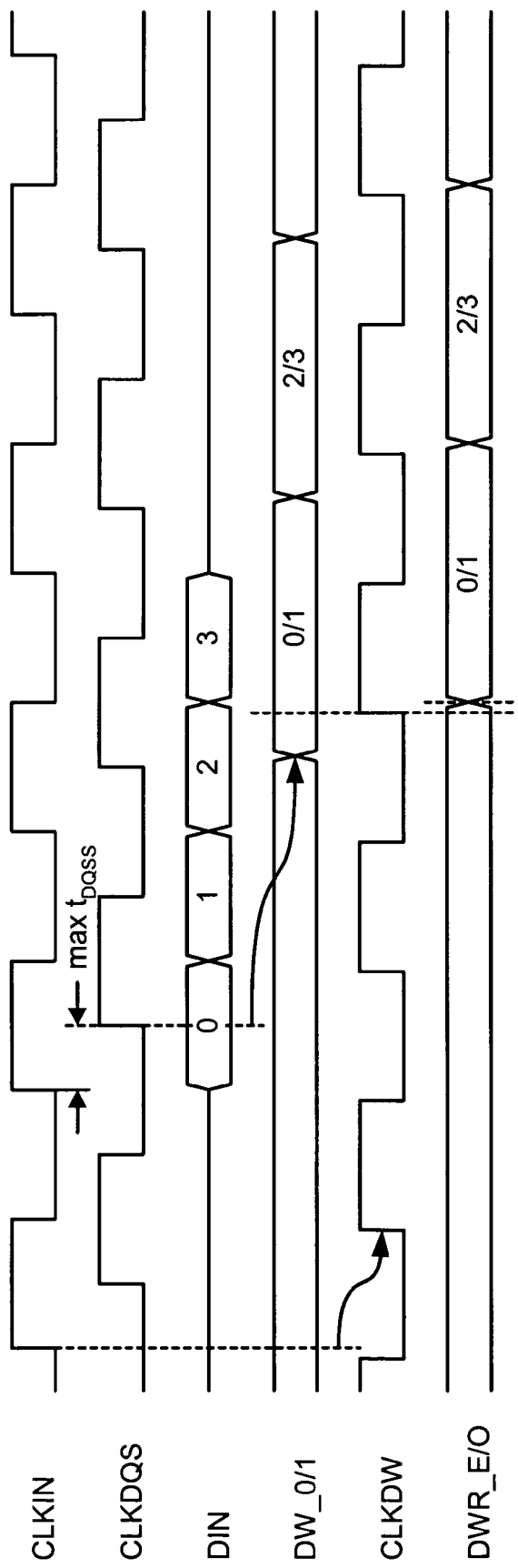

FIGS. 6B and 6C are timing diagrams for a DDR write operation for a minimum and maximum $t_{DQSS}$ delay, respectively. When the $t_{DQSS}$ delay is at the minimum specified value as shown in FIG. 6B, the rising edge of the data strobe signal VDQS (and thus the signal CLKDQS) is ±0.25$t_{CLKIN}$ earlier than that of the input clock signal CLKIN. The data bits on data lines DW_0 and DW_1 are thus shifted left by the same amount (i.e., 0.25$t_{CLKIN}$), but can still be properly latched with the data write clock signal CLKDW and provided on data lines DWR_E and DWR_O.

Conversely, when the $t_{DQSS}$ delay is at the maximum specified value as shown in FIG. 6C, the rising edge of the data strobe signal VDQS (and thus the signal CLKDQS) is 0.25$t_{CLKIN}$ later than that of the input clock signal CLKIN. The data bits on data lines DW_0 and DW_1 are shifted right by the same amount (i.e., 0.25$t_{CLKIN}$), but can still be properly latch with the data write clock signal CLKDW and provided on data lines DWR_E and DWR_O.

Figure 7:
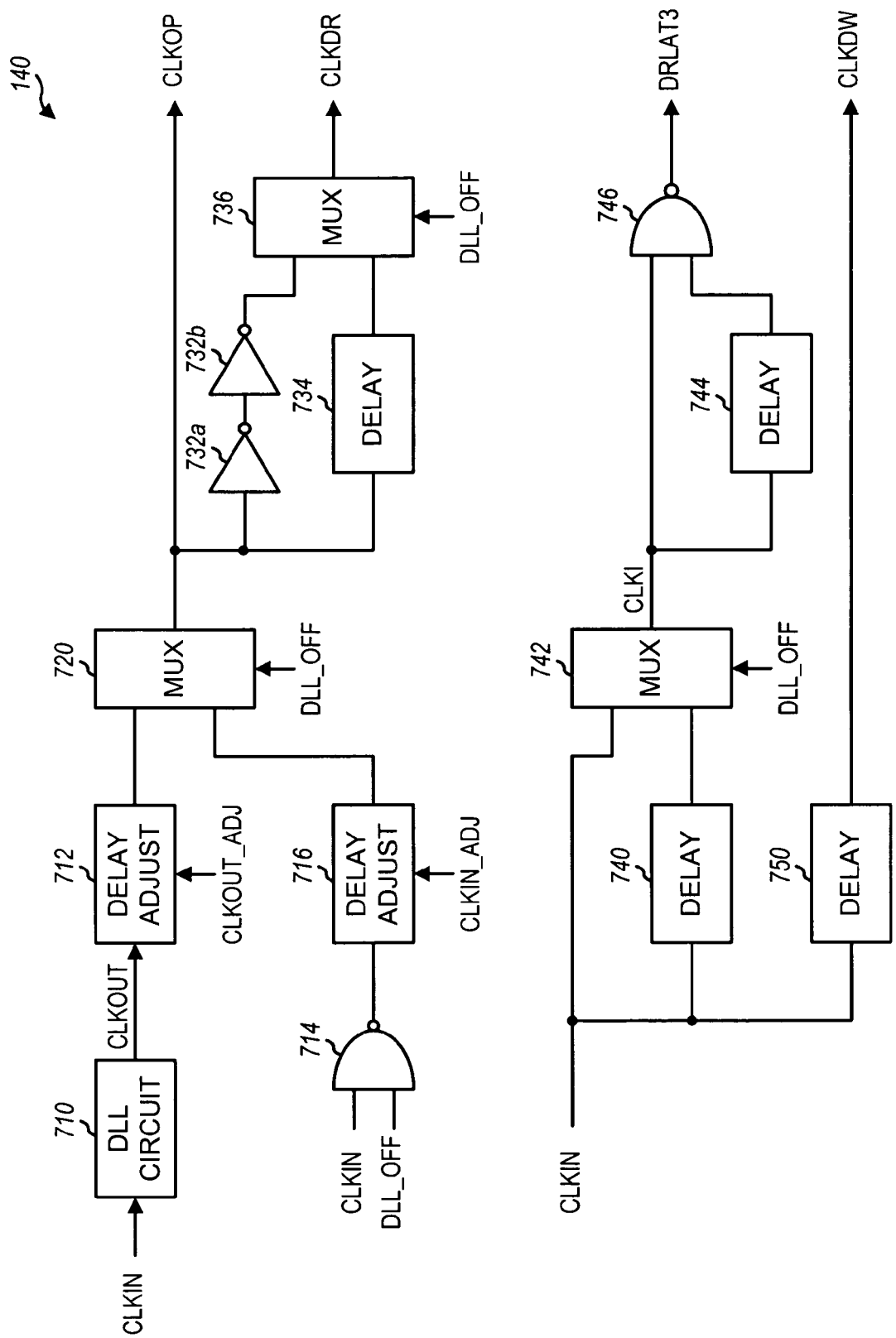
FIG. 7 is a diagram of an embodiment of the clock generation within the memory device.

FIG. 7 is a diagram of an embodiment of the clock generation portion of control circuit 140. In an embodiment, as described above, the data read clock signal CLKDR used to trigger the data bits from the memory array and the clock signal CLKOP used to provide the accessed data bits to the DQ pad in a memory read operation are each generated from either the input clock signal CLKIN or the output clock signal CLKOUT.

In accordance with an aspect of the invention, a delay locked loop (DLL) circuit 710 receives the input clock signal CLKIN (or the chip input clock signal used to generate the clock signal CLKIN) and generates the output clock signal CLKOUT having the characteristics shown in FIG. 4A and described above. Delay locked loop circuit 710 adjusts the phase of the output clock signal CLKOUT such that its rising edges lead the rising edges of the input clock signal CLKIN by a particular amount (e.g., 1.5 nsec) determined necessary to allow for proper alignment the data bits to the input clock signal CLKIN at the device I/O pins. The design of the delay locked loop circuit is known in the art and not described in detail herein. An example design of a delay locked loop circuit is described in U.S. Pat. No. 5,963,069, titled "System for Distributing Clocks Using a Delay Lock Loop in a Programmable Logic Circuit," issued Oct. 5, 1999 and incorporated herein by reference.

The output clock signal CLKOUT from delay locked loop circuit 710 is provided to a delay adjust circuit 712 that delays the signal by an amount determined by a control signal CLKOUT_ADJ. The input clock signal CLKIN and a control signal DLL_OFF are provided to a NAND gate 714, which disables the input clock signal when not operating in the DLL_ON mode. The output from NAND gate 714 is provided to a delay adjust circuit 716 that delays the signal by an amount determined by a control signal CLKIN_ADJ. Delay adjust circuits 712 and 716 allow for adjustment of the output and input clock signals used for data read operations such that various read timing schemes can be supported. The control signals CLKOUT_ADJ and CLKIN_ADJ determine the amounts of delay and can be provided by mode setting registers, fuses, control lines, or other mechanisms. For example, the control signals CLKOUT_ADJ and CLKIN_ADJ can each be provided by means of fuses that are programmed during testing of the device in the manufacturing process.

The phase adjusted clock signals from delay adjust circuits 712 and 716 are provided to a multiplexer 720 that selects the delayed output clock signal when operating in the DLL_ON mode and the delayed input clock signal when operating in the DLL_OFF mode. The output from multiplexer 720 comprises the clock signal CLKOP used for providing the accessed data bits to the DQ pad during a memory read operation. The output from multiplexer 720 is also provided to a pair of series-coupled inverters 732a and 732b and a delay circuit 734. The signal from inverter 732b and the delayed signal from delay circuit 734 are provided to a multiplexer 736 that selects the signal from inverter 732b when operating in the DLL_ON mode and the delayed signal when operating in the DLL_OFF mode. Inverters 732 and delay circuit 734 provide a timing difference between the DLL_OFF and DLL_ON modes. The output from multiplexer 736 comprises the data read clock signal CLKDR. In an embodiment, one clock generation circuit such as that shown in FIG. 7 is provided for each set of data I/O pads 160 (i.e., each set of data I/O pads receives a respective clock signal CLKOP and data read clock signal CLKDR).

The input clock signal CLKIN is used to generate the latch signal DRLAT3 that is used for latching the prefetched data bits during a memory read operation (e.g., for CAS latency 3). The input clock signal CLKIN is provided to a delay circuit 740 that delays the clock signal by a particular amount. The input clock signal CLKIN and the delayed input clock signal from delay circuit 740 are provided to a multiplexer 742 that selects the input clock signal CLKIN when operating in the DLL_ON mode and the delayed clock signal when operating in the DLL_OFF mode. The clock signal CLK1 from multiplexer 742 is provided to a delay circuit 744 and to one input of a NAND gate 746. Delay circuit 744 delays the clock signal CLK1 by a particular amount and provides the delayed signal to the other input of NAND gate 746. The output from NAND gate 746 comprises the latch signal DRLAT3.

The falling edges of the latch signal DRLAT3 are delayed relative to the rising edges of the input clock signal CLKIN (by the delays of multiplexer 742 and NAND gate 746 when operating in the DLL_ON mode, and by the delays of delay circuit 740, multiplexer 742, and NAND gate 746 when operating in the DLL_OFF mode). Delay circuit 744 determines the low pulse width of the latch signal DRLAT3. The latch signal DRLAT3 may be generated based on the falling edge of CLKIN for a different timing setup.

The input clock signal CLKIN is also provided to a delay circuit 750 and delayed by a particular amount (i.e., $t_{DLKDW}$). As noted above, the delay of delay circuit 750 is selected to account for the variations in the $t_{DQSS}$ delay of $\pm 0.25 t_{CLKIN}$. The output of delay circuit 750 comprises the data write clock signal CLKDW used for memory write operations.

Figure 8:
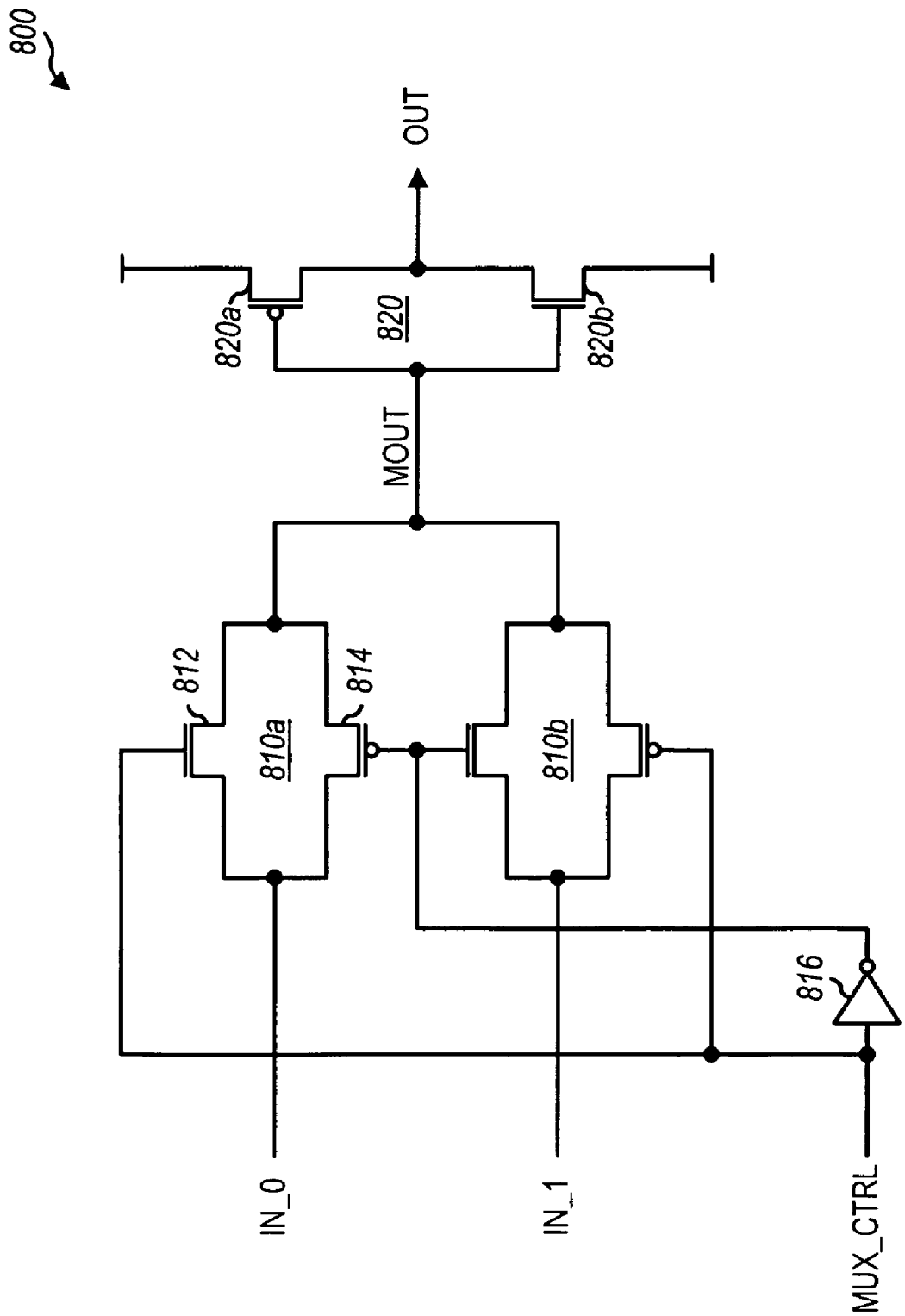
FIG. 8 is a schematic diagram of an embodiment of a 2×1 multiplexer.

FIG. 8 is a schematic diagram of an embodiment of a 2×1 multiplexer 800 that can be used for the 2×1 multiplexers in FIGS. 3B and 5. The input signals IN_0 and IN_1 are provided to the inputs of respective transmission gates 810a and 810b. Each transmission gate 810 comprises an N-channel transistor 812 coupled in parallel with a P-channel transistor 814. A control signal MUX_CTRL couples to a non-inverting control input of transmission gate 810a, an inverting control input of transmission gate 810b, and an input of an inverter 816. The control signal bMUX_CTRL from inverter 816 couples to an inverting control input of transmission gate 810a and a non-inverting control input of transmission gate 810b. The outputs of transmission gates 810a and 810b couple together and form the output of the 2×1 multiplexer.

An inverter 820 can be coupled to the output of the multiplexer to provide buffering, signal inversion, and additional signal drive. Inverter 820 comprises a P-channel transistor 820a coupled in series with an N-channel transistor 820b. The output of inverter 820 comprises the buffered and inverted output of multiplexer 800.

Figure 9:
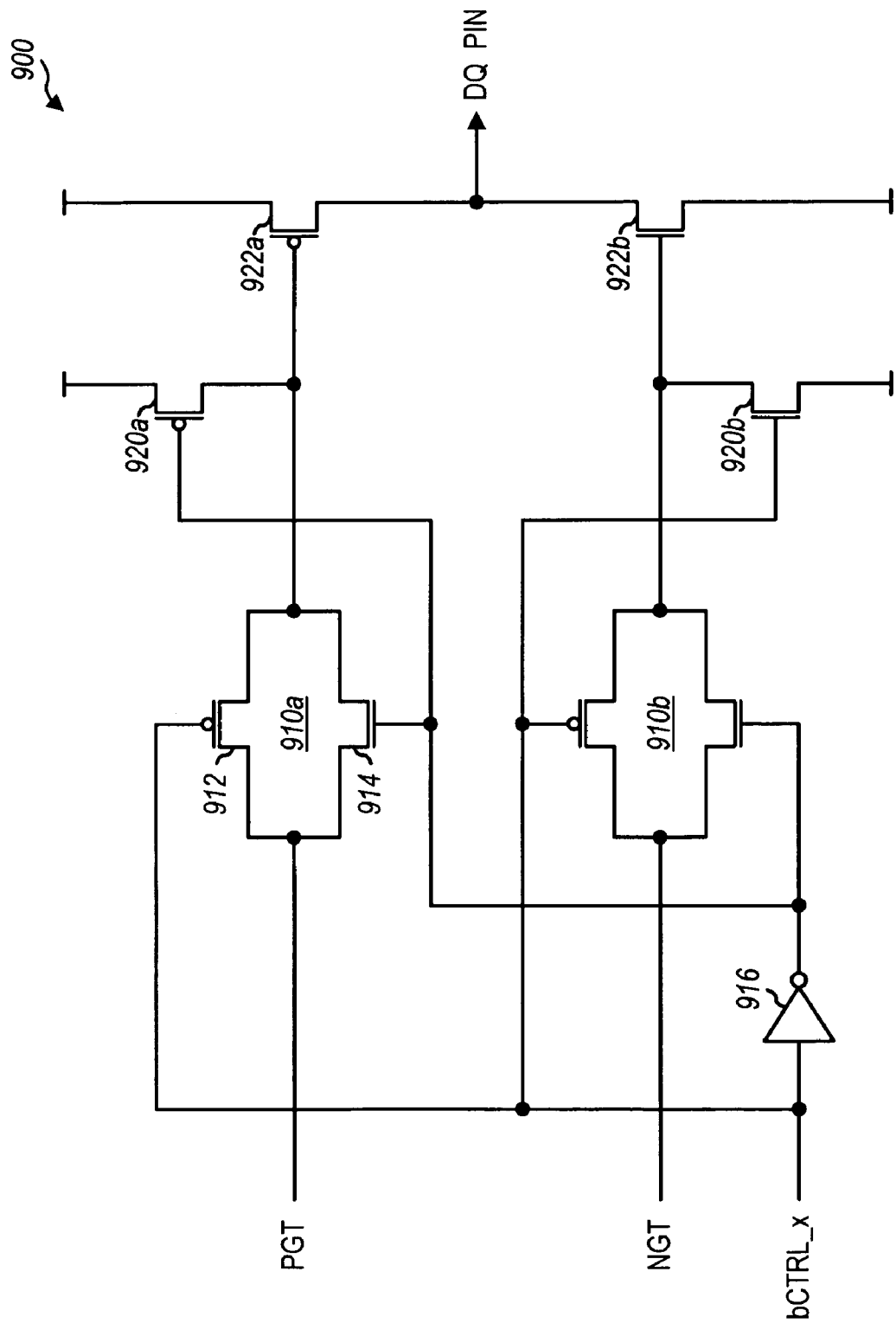
FIG. 9 is a schematic diagram of an embodiment of an output driver.

FIG. 9 is a schematic diagram of an embodiment of an output driver 900 that can be used for one output driver 362 in FIG. 3C. Output driver 900 receives differential input signals PGT and NGT and a control signal bCTRL_x, and drives the associated DQ pin based on the received signals. Output driver 900 is designed to operate on a differential input signal. Other circuits in data output circuit 320 (e.g., register 344 and multiplexer 352) can also be designed to operate on and provide differential output signals.

The input signals PGT and NGT are provided to the inputs of respective transmission gates 910a and 910b. Each transmission gate 910 comprises an N-channel transistor 912 coupled in parallel with a P-channel transistor 914. The control signal bCTRL_x couples to the inverting control inputs of transmission gates 910a and 910b and an input of an inverter 916. The control signal CTRL_x from inverter 916 couples to the non-inverting control inputs of transmission gates 910a and 910b. The output of transmission gate 910a couples to the source of a P-channel transistor 920a and to the gate of a P-channel transistor 922a. The output of transmission gate 910b couples to the source of an N-channel transistor 920b and to the gate of an N-channel transistor 922b. The control signal bCTRL_x couples to the gate of transistor 920a, and the control signal CTRL_x couples to the gate of transistor 920b.

Output driver 900 is enabled when the control signal bCTRL_x is low and tri-stated when the control signal bCTRL_x is high. Output driver 900 operates as follows.

When the control signal bCTRL_x is low, transmission gates 910a and 910b are turned on and the input signals PGT and NGT are provided to the gates of transistors 922a and 922b, respectively. Transistors 920a and 920b are also turned off when the control signal bCTRL_x is low, thereby enabling the operation of transistors 922a and 922b. Thus, when the control signal bCTRL_x is low, the DQ pin can be driven low or high by the input signals PGT and NGT. Conversely, when the control signal bCTRL_x is high, transmission gates 910a and 910b are turned off. Transistors 920a and 920b are also turned on, which then disables transistors 922a and 922b.

The data input and output circuits of the invention provide many advantages. The data input and output circuits support concurrent write and read of multiple data bits to and from multiple memory cells in a multi-data rate mode. The data input and output circuits also support a number of read and write modes, and can advantageously be used to support various timing requirements.

Although the invention is described for a specific embodiment, alternative implementations of the invention and modifications of the data input and output circuits described herein can be made. For example, the clock signals described herein can be generated in different manners and/or based on different signals. Further, the latching circuits and multiplexers described herein can be implemented with other circuits or differently than that described above. Thus, the specific implementation details are intended to be illustrative, and not limitations, of the present invention.

The architectures described herein can support single data rate (SDR) operation as well as double data rate (DDR) operation. A more detail discussion of operating a memory array in DDR operation is included in U.S. patent application Ser. No. 09/195,269, entitled "Memory Array Architecture for Multi-Data Rate Operation," filed Nov. 18, 1998 and Ser. No. 09/235,222, entitled "Memory Array Architecture Supporting Block Write Operation," filed Jan. 22, 1999, both assigned to the assignee of the present invention and incorporate herein by reference.

The general inventive concepts described herein can be extended to concurrent memory access of any number of data bits. For example, the circuits described herein can be modified to support a quadruple data rate operation, an octal data rate operation, or a Q data rate operation (where Q is any integer greater than one).

The data input and output circuits described herein can be implemented within a stand-alone integrated circuit (IC) such as, for example, a dynamic random access memory (DRAM) IC, a synchronous graphics RAM (SGRAM), and other memory devices. The memory arrays can also be implemented within other ICs, such as a processor, a controller, a digital signal processor, an application specific integrated circuit (ASIC), and others. The circuits described herein can be implemented on a memory array that is embedded within an integrated circuit such as, for example, central processing unit (CPU).

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein, and as defined by the following claims.

What is claimed is:

1. A data output circuit comprising:
    a first multiplexer configured to receive a set of data bits in a first order and provide the set of data bits in a second order;
    data latches coupled to the first multiplexer and configured to receive and latch the set of data bits in the second order to provide a set of latched data bits;
    a second multiplexer coupled to the data latches and configured to receive and multiplex the set of latched data bits to provide time multiplexed data bits; and
    at least one output driver coupled to the second multiplexer and configured to receive and provide signal drive for the time multiplexed data bits.

2. The data output circuit of claim 1, where the first multiplexer in configured to receive one or more pairs of data bits associated with even and odd memory addresses and provide one or more corresponding pairs of data bits for first and second temporal order to be provided from the at least one output driver.

3. The data output circuit of claim 2, where one of the even and odd memory addresses is received and the other address is generate internally.

4. The data output circuit of claim 3, where the even and odd memory addresses are consecutively numbered.

5. The data output circuit of claim 1, wherein the data latches or the second multiplexer, or both, is operable to provide the time multiplexed data bits based on a clock signal having an adjustable phase.

6. The data output circuit of claim 5, further comprising:
    a delay lock loop circuit configured to provide the clock signal having the adjustable phase.

7. The data output circuit of claim 1, wherein the data latches are operable to latch the set of data bits in the second order with a latch signal having a phase that is selected based on an operating mode of the data output circuit.

8. The data output circuit of claim 1, wherein the data latches comprise
    a set of latches configured to latch the set of data bits in the second order with a latch signal.

9. The data output circuit of claim 8, wherein the latch signal is related to an input clock signal provided for clocking out data bits.

10. The data output circuit of claim 9, wherein the latch signal is delayed relative to the input clock signal by a selectable amount based on an operating mode of the data output circuit.

11. The data output circuit of claim 1, wherein the data latches comprise
    a set of registers configured to register the set of data bits in the second order with a data read clock signal.

12. The data output circuit of claim 11, wherein the data read clock signal is generate based on one of a plurality of clock signals depending on an operating mode of the data output circuit.

13. The data output circuit of claim 12, wherein the data read clock signal is further delayed by an amount depending on the operating mode of the data output circuit.

14. The data output circuit of claim 1, wherein the data latches comprise
    a set of latches configured to latch the set of data bits in the second order with a latch signal, and
    a set of registers configured to register the set of data bits from the set of latches with a data read clock signal.

15. The data output circuit of claim 1, wherein the set of data bits in the first order is provided from a memory array based on a falling edge of an input clock signal.

16. The data output circuit of claim 1, wherein each of the at least one output driver is configured to receive and provide signal drive for the time multiplexed data bits, and wherein at least a subset of the at least one output driver can each be individually enabled and disabled to provide variable drive capability.

17. The data output circuit of claim 16, wherein the at least one output driver can be disabled to place the data output circuit in a tri-state condition.

18. The data output circuit of claim 1, and operable in a double data rate (DDR) write operation wherein two data bits are received, ordered, latched, and provided from the at least one output driver for each active clock cycle.

19. An integrated circuit comprising a plurality of data output circuits of claim 1.

20. A DRAM device comprising at least 32 data output circuits of claim 1, one data output circuit for each device data pin.

21. A data output circuit for use in a memory device comprising:
    a first multiplexer configured to receive even and odd sequences of data bits and provide first and second sequences data bits, wherein the even sequence includes data bits prefetched from memory cells having even addresses and the odd sequence includes data bits prefetched from memory cells having odd addresses, and wherein the first sequence includes data bits to be provided from the data output circuit on a first clock phase and the second sequence includes data bits to be provided on a second clock phase;
    a first set of latches coupled to the first multiplexer and configured to latch the first and second sequences data bits with a latch signal;
    a second set of latches coupled to the first set of latches and configured to latch the sequences from the first set of latches with a data read clock signal;
    a second multiplexer coupled to the second set of latches and configured to receive and multiplex the sequences of latched data bits to provide a sequence of time multiplexed data bits; and
    at least one output driver coupled to the second multiplexer and configured to receive and provide signal drive for the sequence of time multiplexed data bits.

22. A data input circuit comprising:
    a demultiplexer configured to receive and demultiplex a sequence of time multiplexed data bits into a plurality of sequences of data bits, wherein the sequence of time multiplexed data bits includes two data bits per active cycle of an input clock signal, wherein the plurality of sequences of data bits include a first sequence and a second sequence, wherein the first sequence includes data bits corresponding to a first phase of the input clock signal, and wherein the second sequence includes data bits corresponding to a second phase of the input clock signal;
    a multiplexer coupled to the demultiplexer and configured to receive and order the plurality of sequences of data bits to provide a plurality of ordered sequences; and
    a plurality of driver circuits coupled to the multiplexer, each driver circuit configured to receive a respective sequence of data bits from the multiplexer and drive a respective data line.

23. The data input circuit of claim 22, wherein the multiplexer is configured to receive and order the first and second sequences to provide an even sequence and an odd sequence, the even sequence including data bits corresponding to memory cells having even addresses and the odd sequence including data bits corresponding to memory cells having odd addresses.

24. The data input circuit of claim 22, wherein the demultiplexer includes
    a first set of latches configured to receive and latch the sequence of time multiplexed data bits with a plurality of phases of a latch signal to provide the plurality of sequences of data bits.

25. The data input circuit of claim 24, wherein the latch signal is generated from a DQS signal indicative of presence of valid data.

26. The data input circuit of claim 24, further comprising:
    a second set of latches configured to receive and latch the plurality of ordered sequences with a data write clock signal, and
    wherein the plurality of driver circuits couple to the second set of latches and are configured to receive respective sequences of data bits from the second set of latches and drive respective data lines.

27. A data input circuit for use in a memory device comprising:
    a demultiplexer configured to receive and demultiplex a sequence of time multiplexed data bits into first and second sequences of data bits, wherein the first sequence includes data bits from the sequence of time multiplexed data bits that are associated with a first clock phase and the second sequence includes data bits from the sequence of time multiplexed data bits that are associated with a second clock phase;
    a multiplexer coupled to the demultiplexer and configured to receive the first and second sequences of data bits and provide even and odd sequences of data bits, wherein the even sequence includes data bits to be provided to memory cells having even addresses and the odd sequence includes data bits to be provided to memory cells having odd addresses;
    a set of latches coupled to the multiplexer and configured to receive and latch the even and odd sequences of data bits with a data write clock signal; and
    a plurality of driver circuits coupled to the set of latches, each driver circuit configured to receive a respective sequence of data bits from the set of latches and drive a respective data line.

28. A method for providing a plurality of data bits to an output node in a multi data rate operation, the method comprising:
    receiving a set of data bits in a first order;
    ordering the set of data bits in the first order to provide a set of data bits in a second order;
    latching the set of data bits in the second order to provide a set of latched data bits;
    time multiplexing the set of latched data bits into a sequence of time multiplexed data bits; and
    providing the sequence of time multiplexed data bits to the output node.

29. The method of claim 28, wherein the set of data bits in the first order corresponds to even and odd memory addresses and the set of data bits in the second order corresponds to first and second temporal order to be provided to the output node.

30. The method of claim 28, wherein the latching the set of data bits in the second order includes
    latching the set of data bits in the second order with a latch signal to provide a set of first latched data bits.

31. The method of claim 30, wherein the latching the set of data bits in the second order further includes
    latching the set of first latched data bits with a data read clock signal to provide a set of second latched data bits.

32. The method of claim 31, further comprising:
    generating the data read clock signal based on one of a plurality of clock signals depending on a particular operation mode.

33. The method of claim 31, wherein the latching the set of data bits in the second order further includes
    latching one data bit in the set of second latched data bits with a signal related to the data read clock signal to provide a set of time aligned data bits.

34. The method of claim 28, wherein the providing the sequence of time multiplexed data bits comprises
    providing the sequence of time multiplexed data bits to the output node with variable drive strength.

* * * * *